(12) United States Patent
Garcia

(10) Patent No.: US 11,205,733 B2
(45) Date of Patent: Dec. 21, 2021

(54) SEMI-TRANSPARENT SOLAR PANEL APPARATUS

(71) Applicant: Ricardo Garcia, London (CA)

(72) Inventor: Ricardo Garcia, London (CA)

(*) Notice: Subject to any disclaimer, the term of this patent is extended or adjusted under 35 U.S.C. 154(b) by 138 days.

(21) Appl. No.: 16/509,119

(22) Filed: Jul. 11, 2019

(65) Prior Publication Data

US 2021/0013350 A1 Jan. 14, 2021

(51) Int. Cl.
| | |
|---|---|
| *H01L 31/0468* | (2014.01) |
| *H01L 31/0352* | (2006.01) |
| *H01L 31/048* | (2014.01) |
| *H01L 31/049* | (2014.01) |
| *H02S 30/10* | (2014.01) |

(52) U.S. Cl.
CPC .. *H01L 31/0468* (2014.12); *H01L 31/035281* (2013.01); *H01L 31/049* (2014.12); *H01L 31/0481* (2013.01); *H01L 31/0488* (2013.01); *H02S 30/10* (2014.12)

(58) Field of Classification Search
CPC ............... H01L 31/048; H01L 31/0481; H01L 31/0488; H01L 31/049; H01L 31/0468; H01L 31/035281; H02S 30/10
See application file for complete search history.

(56) References Cited

U.S. PATENT DOCUMENTS

| | | | |
|---|---|---|---|
| 4,461,922 A | * | 7/1984 | Gay ..................... H01L 31/048 |
| | | | 136/249 |
| 8,186,100 B2 | | 5/2012 | Chuang |
| 8,745,919 B2 | | 6/2014 | Chang |
| 9,301,455 B2 | | 4/2016 | Chuang |
| D767,484 S | | 9/2016 | Morad |
| 9,509,247 B1 | | 11/2016 | Hinson |
| 2008/0000195 A1 | * | 1/2008 | Clarahan ................ H02S 30/10 |
| | | | 52/786.13 |
| 2009/0266441 A1 | | 10/2009 | Mathai |
| 2010/0175749 A1 | | 7/2010 | Tsutsumi |
| 2010/0279458 A1 | | 11/2010 | Yeh |
| 2011/0017280 A1 | | 1/2011 | Rambsy |
| 2012/0042946 A1 | | 2/2012 | Masunaga |
| 2016/0105145 A1 | | 4/2016 | Drake |

* cited by examiner

*Primary Examiner* — Lindsey A Bernier

(57) ABSTRACT

A semi-transparent solar panel apparatus for allowing light to pass through solar panels onto crops to maximize solar collection areas includes a plurality of cell columns comprising a plurality of solar cells. Each cell column has a space between the adjacent cell columns to allow light to pass therethrough. A pair of encapsulant sheets is coupled together on either side of the plurality of cell columns to maintain the arrangement of the cell columns. A bottom frame is coupled to the pair of encapsulant sheets. The pair of encapsulant sheets is coupled to a bottom horizontal portion within a bottom vertical portion. A top frame is coupled to the bottom frame with a top vertical portion coupled to the bottom vertical portion of the bottom frame to seal the pair of encapsulant sheets between a top horizontal portion and the bottom horizontal portion.

7 Claims, 4 Drawing Sheets

SEMI-TRANSPARENT SOLAR PANEL APPARATUS

CROSS-REFERENCE TO RELATED APPLICATIONS

Not Applicable

STATEMENT REGARDING FEDERALLY SPONSORED RESEARCH OR DEVELOPMENT

Not Applicable

THE NAMES OF THE PARTIES TO A JOINT RESEARCH AGREEMENT

Not Applicable

INCORPORATION-BY-REFERENCE OF MATERIAL SUBMITTED ON A COMPACT DISC OR AS A TEXT FILE VIA THE OFFICE ELECTRONIC FILING SYSTEM

Not Applicable

STATEMENT REGARDING PRIOR DISCLOSURES BY THE INVENTOR OR JOINT INVENTOR

Not Applicable

BACKGROUND OF THE INVENTION

(1) Field of the Invention

(2) Description of Related Art Including Information Disclosed Under 37 CFR 1.97 and 1.98

The disclosure and prior art relates to solar panels and more particularly pertains to a new solar panel for allowing light to pass through solar panels onto crops to maximize solar collection areas.

BRIEF SUMMARY OF THE INVENTION

An embodiment of the disclosure meets the needs presented above by generally comprising a plurality of cell columns comprising a plurality of solar cells. Each cell column has a space between the adjacent cell columns to allow light to pass therethrough. A pair of encapsulant sheets is coupled to the plurality of cell columns. The pair of encapsulant sheets is coupled together on either side of the plurality of cell columns to maintain the arrangement of the cell columns. The pair of encapsulant sheets is translucent. A bottom frame is coupled to the pair of encapsulant sheets. The bottom frame is rectangular and has a bottom horizontal portion and a bottom vertical portion. The pair of encapsulant sheets is coupled to the horizontal portion within the vertical portion. A top frame is coupled to the bottom frame. The top frame conforms to the bottom frame and has a top horizontal portion and a top vertical portion. The top vertical portion is coupled to the bottom vertical portion of the bottom frame to seal the pair of encapsulant sheets between the top horizontal portion and the bottom horizontal portion.

There has thus been outlined, rather broadly, the more important features of the disclosure in order that the detailed description thereof that follows may be better understood, and in order that the present contribution to the art may be better appreciated. There are additional features of the disclosure that will be described hereinafter and which will form the subject matter of the claims appended hereto.

The objects of the disclosure, along with the various features of novelty which characterize the disclosure, are pointed out with particularity in the claims annexed to and forming a part of this disclosure.

BRIEF DESCRIPTION OF SEVERAL VIEWS OF THE DRAWING(S)

The disclosure will be better understood and objects other than those set forth above will become apparent when consideration is given to the following detailed description thereof. Such description makes reference to the annexed drawings wherein.

DETAILED DESCRIPTION OF THE INVENTION

Figure 1:
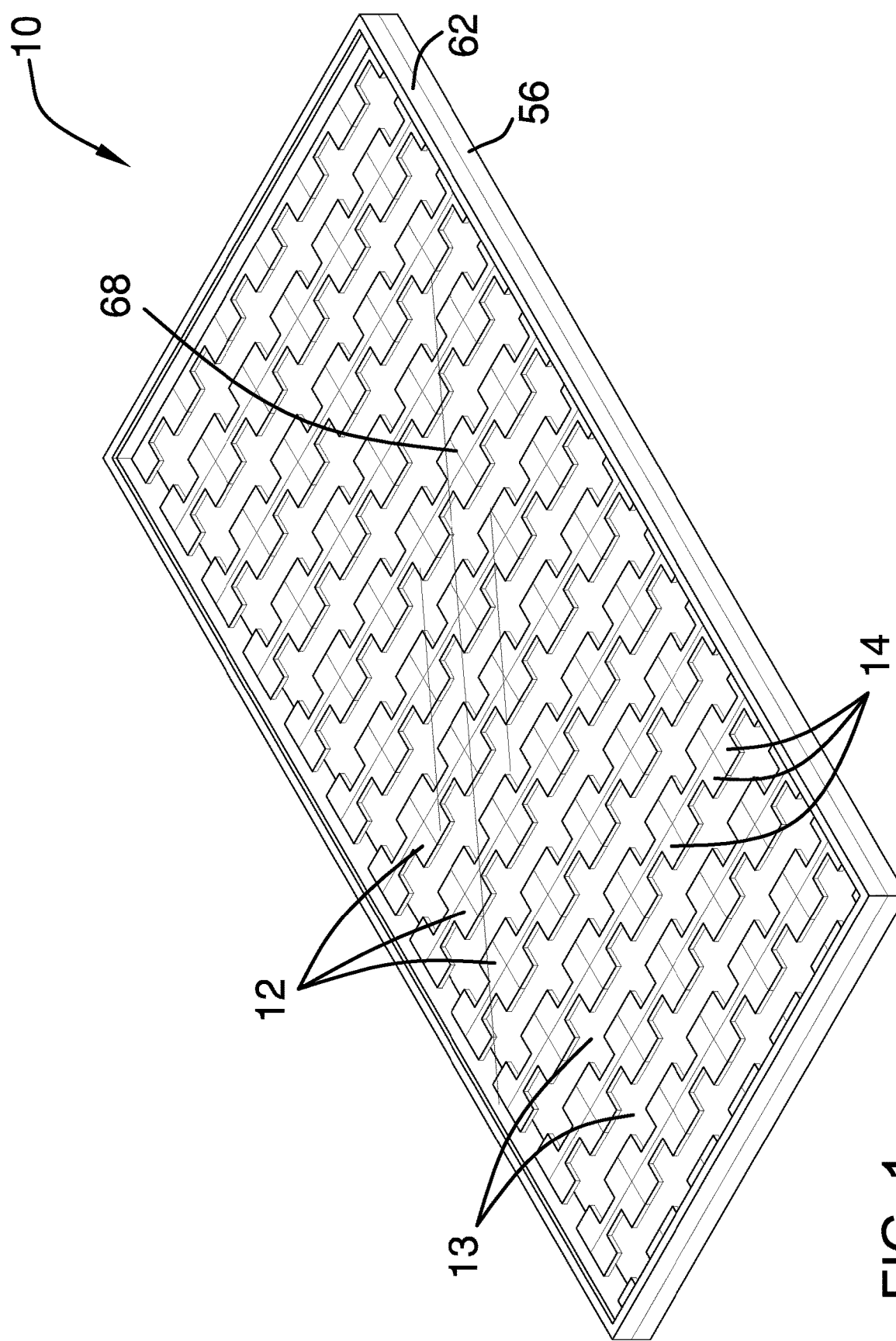
FIG. 1 is an isometric view of a semi-transparent solar panel apparatus according to an embodiment of the disclosure.
Figure 2:
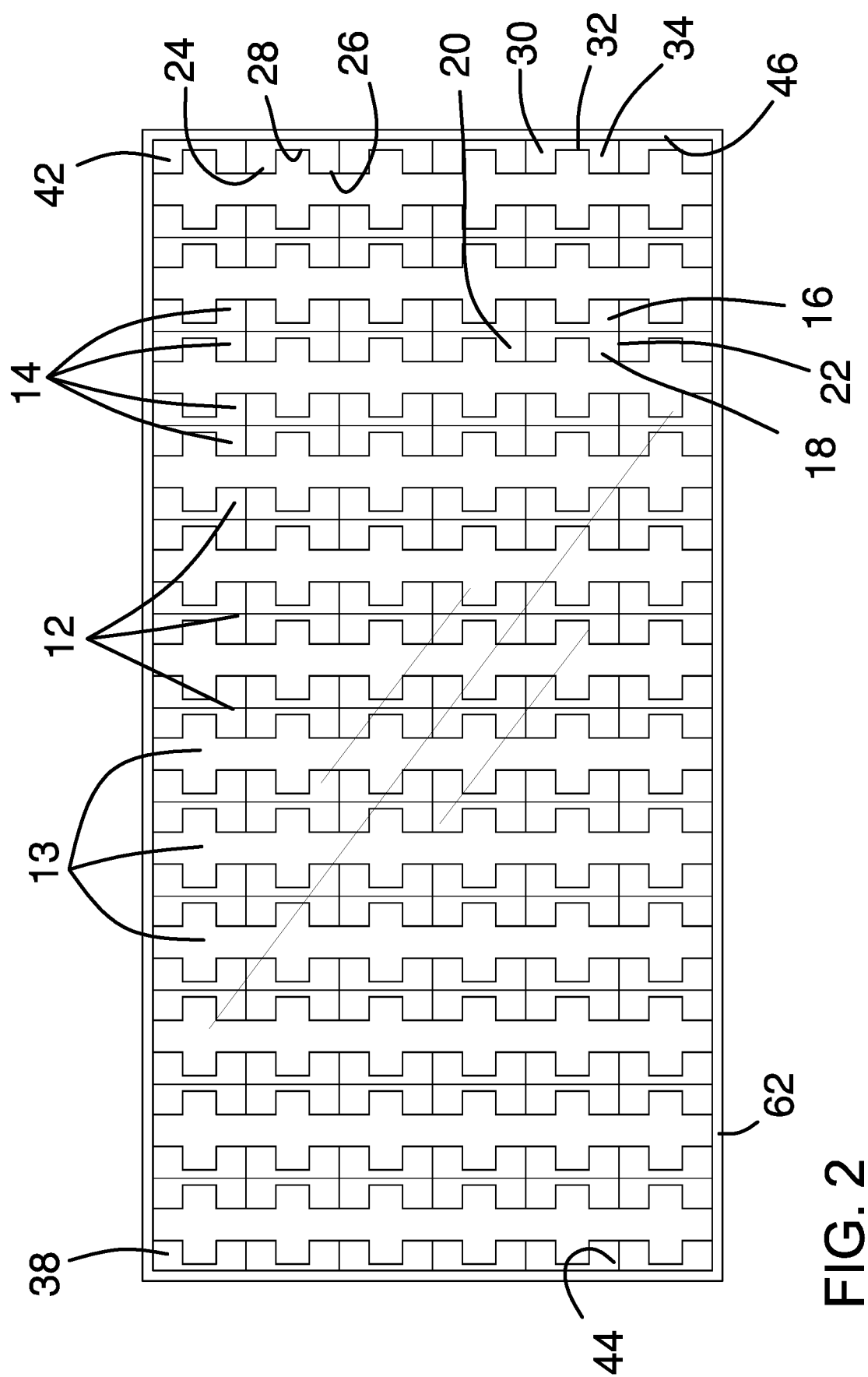
FIG. 2 is a front elevated view of an embodiment of the disclosure.
Figure 3:
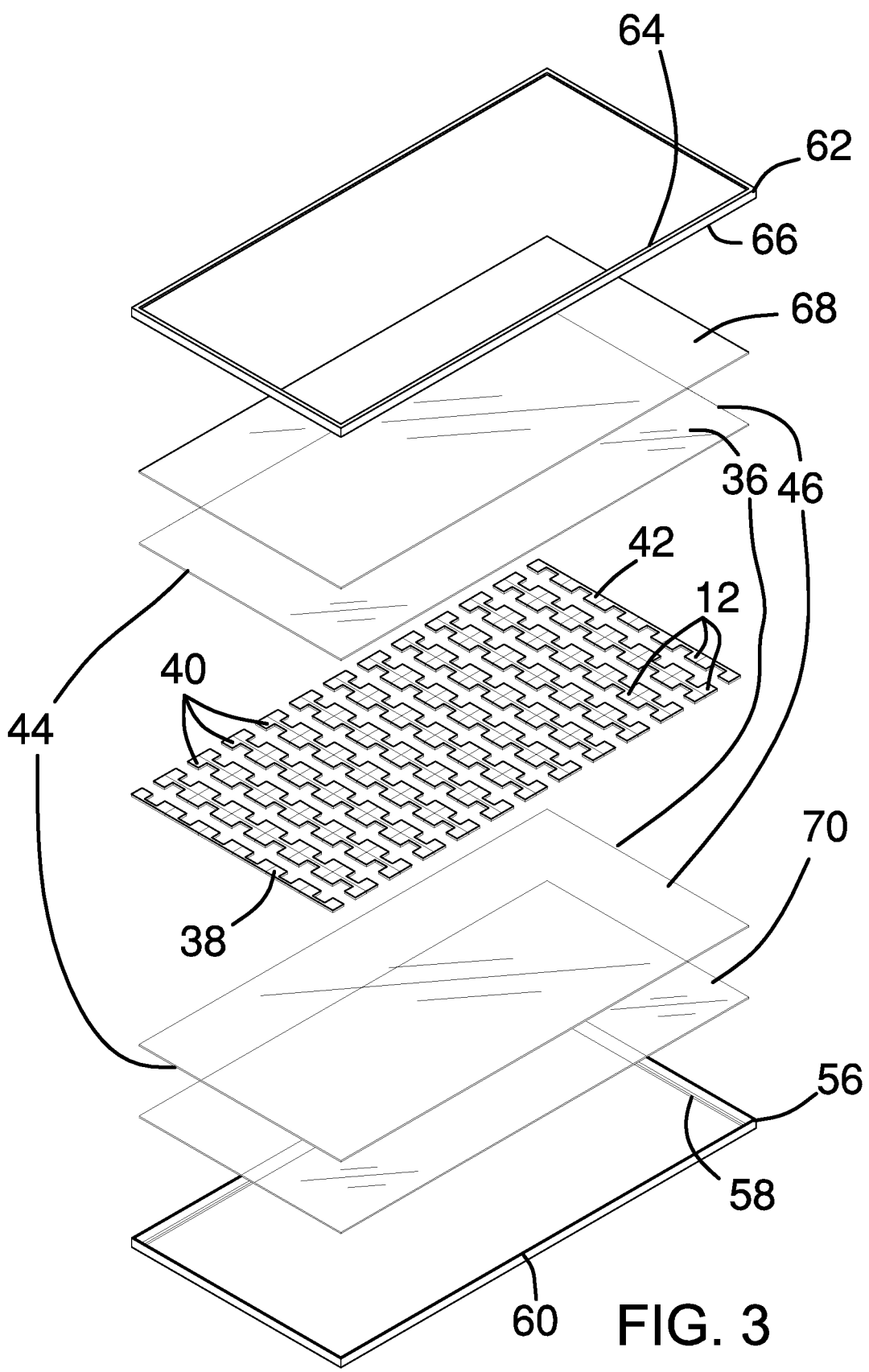
FIG. 3 is an isometric exploded view of an embodiment of the disclosure.
Figure 4:
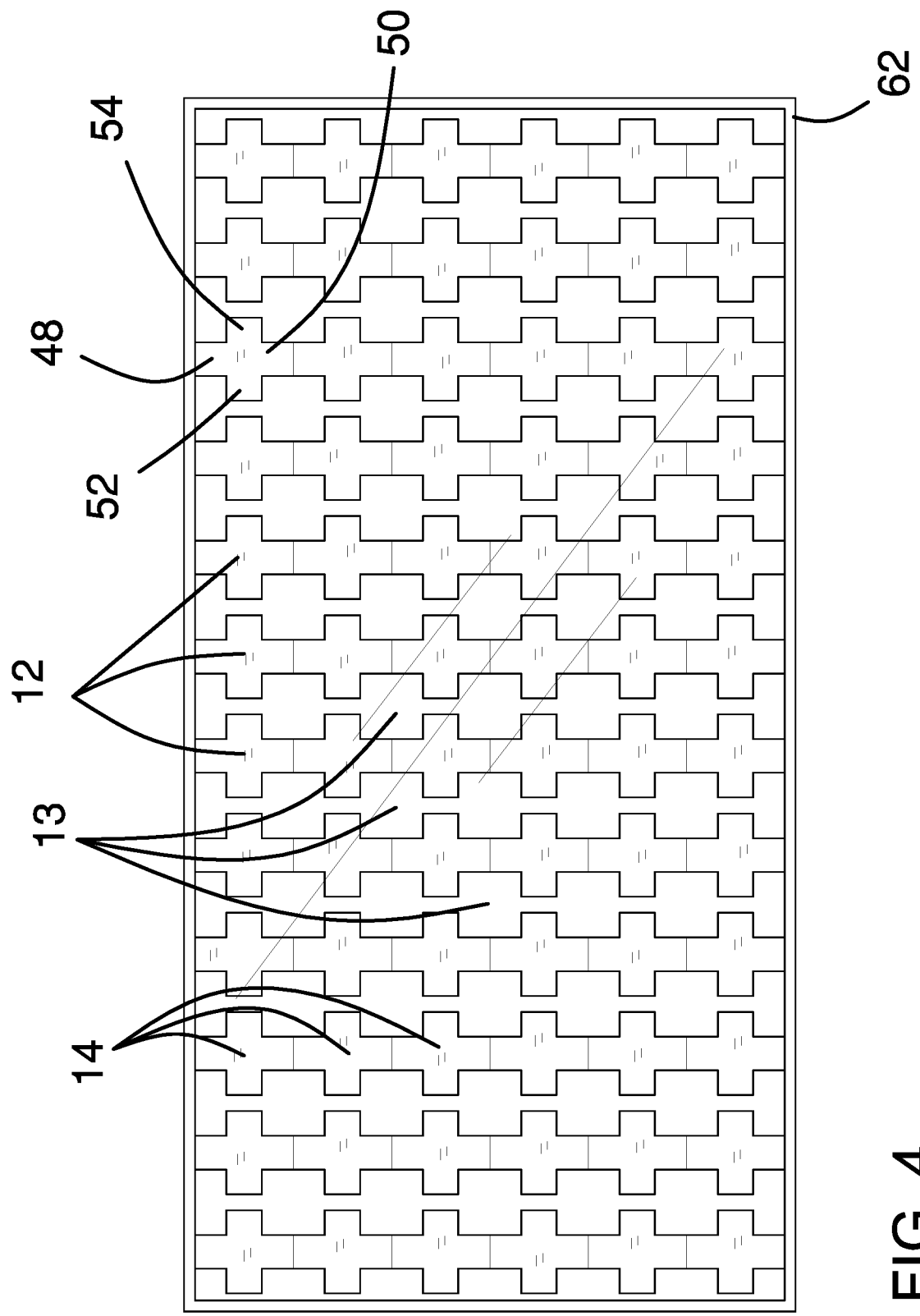
FIG. 4 is a front elevation view of an embodiment of the disclosure.

With reference now to the drawings, and in particular to FIGS. 1 through 4 thereof, a new solar panel embodying the principles and concepts of an embodiment of the disclosure and generally designated by the reference numeral 10 will be described.

As best illustrated in FIGS. 1 through 4, the semi-transparent solar panel apparatus 10 generally comprises a plurality of cell columns 12 comprising a plurality of solar cells 14. Each of the solar cells 14 has an inner side 16, an outer side 18, a top side 20, and a bottom side 22. The inner side 16 is vertical, the top side 20 and the bottom side 22 extend perpendicularly from the inner side 16, and the outer side 18 has an upper section 24 extending perpendicularly from the top side 20. A lower section 26 extends perpendicularly from the bottom side 22, and a medial indent section 28 extends between the upper section 24 and the lower section 26 towards the inner side 16. The inner side 16 defines an upper square portion 30, a medial thin portion 32, and a lower square portion 34 of the solar cell 14. Each solar cell 14 would thus form a squared C-shape, either a C1 shape or a C2 shape depending on orientation.

Each cell column 12 has a space 13 between the adjacent cell columns 12 to allow light to pass therethrough. A width of each of the upper square portion 30 and the lower square portion 34 of each solar cell 14 substantially conform to a width of the space 13 between the upper square portions 30 and the lower square portions 34 of the solar cells 14 of adjacent cell columns 12. The width of the space 13 may be adjusted depending on the desired amount of light to be transmitted through the apparatus 10.

A pair of encapsulant sheets 36 is coupled together on either side of the plurality of cell columns 12 to maintain the arrangement of the cell columns 12. The pair of encapsulant sheets 36 is translucent and vacuum laminated ethylene vinyl acetate. The plurality of cell columns 12 comprises a leftmost column 38, a plurality of central columns 40, and a rightmost column 42. The leftmost column 38 has the solar cells 14 coupled with the top side 20 to the bottom side 22 of the adjacent solar cell 14 with the inner side 16 of each cell 14 adjacent a leftmost edge 44 of the pair of encapsulant sheets 36. The rightmost column 42 has the solar cells 14 coupled with the top side 20 to the bottom side 22 of the adjacent solar cell 14 with the inner side 16 of each cell 14 adjacent a rightmost edge 46 of the pair of encapsulant sheets 36. Each central column 40 has pairs of the C1 shape and C2 shape solar cells 14 coupled with the inner side 16 to the inner side 16. The pairs of the solar cells 14 are coupled with the top sides 20 to the bottom sides 22 of the adjacent pairs of the solar cells 14.

Alternatively, each of the solar cells 14 may be plus-shaped, or D shape, and has a top square portion 48, a bottom square portion 50, a left square portion 52, and a right square portion 54. The solar cells 14 of each of the plurality of cell columns 12 is coupled with the top square portion 48 to the bottom square portion 50 of the adjacent solar cell 14.

A bottom frame 56 is coupled to the pair of encapsulant sheets 36. The bottom frame 56 is rectangular and has a bottom horizontal portion 58 and a bottom vertical portion 60. The pair of encapsulant sheets 36 is coupled to the bottom horizontal portion 58 within the bottom vertical portion 60. A top frame 62 is coupled to the bottom frame 56. The top frame 62 conforms to the bottom frame 56 and has a top horizontal portion 64 and a top vertical portion 66. The top vertical portion 66 is coupled to the bottom vertical portion 60 of the bottom frame 56 to seal the pair of encapsulant sheets 36 between the top horizontal portion 64 and the bottom horizontal portion 58. A weather protection pane 68 is coupled to the pair of encapsulant sheets 36. The weather protection pane 68 conforms to the pair of encapsulant sheets 36 and is coupled between the pair of encapsulant sheets 36 and the top frame 62. A moisture protection barrier 70 is coupled to the pair of encapsulant sheets 36. The moisture protection barrier 70 conforms to the pair of encapsulant sheets 36 and is coupled between the pair of encapsulant sheets 36 and the bottom frame 56.

The plurality of solar cells 14, the pair of encapsulant sheets 36, the bottom frame 56, the top frame 62, the weather protection pane 68, and the moisture protection barrier 70 may each be rigid, semi-rigid, or flexible depending on the desired application of the apparatus 10.

In use, the apparatus 10 is installed on a greenhouse roof or other agricultural shade structure intended to only partially block the sun. The apparatus 10 is connected to a battery bank to store electricity for use at peak hours.

With respect to the above description then, it is to be realized that the optimum dimensional relationships for the parts of an embodiment enabled by the disclosure, to include variations in size, materials, shape, form, function and manner of operation, assembly and use, are deemed readily apparent and obvious to one skilled in the art, and all equivalent relationships to those illustrated in the drawings and described in the specification are intended to be encompassed by an embodiment of the disclosure.

Therefore, the foregoing is considered as illustrative only of the principles of the disclosure. Further, since numerous modifications and changes will readily occur to those skilled in the art, it is not desired to limit the disclosure to the exact construction and operation shown and described, and accordingly, all suitable modifications and equivalents may be resorted to, falling within the scope of the disclosure. In this patent document, the word "comprising" is used in its non-limiting sense to mean that items following the word are included, but items not specifically mentioned are not excluded. A reference to an element by the indefinite article "a" does not exclude the possibility that more than one of the element is present, unless the context clearly requires that there be only one of the elements.

I claim:

1. A semi-transparent solar panel apparatus comprising:
a plurality of cell columns, each of the plurality of cell columns comprising a plurality of solar cells, each cell column having a space between the adjacent cell columns to allow light to pass therethrough;
a pair of encapsulant sheets coupled to the plurality of cell columns, the pair of encapsulant sheets being coupled together on either side of the plurality of cell columns to maintain the arrangement of the cell columns; the pair of encapsulant sheets being translucent;
a bottom frame coupled to the pair of encapsulant sheets, the bottom frame being rectangular and having a bottom horizontal portion and a bottom vertical portion, the pair of encapsulant sheets being coupled to the bottom horizontal portion within the bottom vertical portion;
a top frame coupled to the bottom frame, the top frame conforming to the bottom frame and having a top horizontal portion and a top vertical portion, the top vertical portion being coupled to the bottom vertical portion of the bottom frame to seal the pair of encapsulant sheets between the top horizontal portion and the bottom horizontal portion; and
each of the solar cells having an inner side, an outer side, a top side, and a bottom side, the inner side being vertical, the top side and the bottom side extending perpendicularly from the inner side, and the outer side having an upper section extending perpendicularly from the top side, a lower section extending perpendicularly from the bottom side, and a medial indent section extending between the upper section and the lower section towards the inner side, the inner side defining an upper square portion, a medial thin portion, and a lower square portion of the solar cell.

2. The semi-transparent solar panel apparatus of claim 1 further comprising the plurality of cell columns comprising a leftmost column, a plurality of central columns, and a rightmost column, the leftmost column having the solar cells coupled with the top side to the bottom side of the adjacent solar cell with the inner side of each cell adjacent a leftmost edge of the pair of encapsulant sheets, the rightmost column having the solar cells coupled with the top side to the bottom side of the adjacent solar cell with the inner side of each cell adjacent a rightmost edge of the pair of encapsulant sheets, each central column having pairs of the solar cells coupled with the inner side to the inner side, the pairs of the solar cells being coupled with the top sides to the bottom sides of the adjacent pairs of the solar cells.

3. The semi-transparent solar panel apparatus of claim 1 further comprising a width of each of the upper square portion and the lower square portion of each solar cell substantially conforming to a width of the space between the upper square portions and the lower square portions of the solar cells of adjacent cell columns.

4. The semi-transparent solar panel apparatus of claim 1 further comprising a weather protection pane coupled to the pair of encapsulant sheets, the weather protection pane conforming to the pair of encapsulant sheets and being coupled between the pair of encapsulant sheets and the top frame.

5. The semi-transparent solar panel apparatus of claim 1 further comprising a moisture protection barrier coupled to the pair of encapsulant sheets, the moisture protection barrier conforming to the pair of encapsulant sheets and being coupled between the pair of encapsulant sheets and the bottom frame.

6. The semi-transparent solar panel apparatus of claim 1 further comprising the pair of encapsulant sheets being vacuum laminated ethylene vinyl acetate.

7. A semi-transparent solar panel apparatus comprising:
a plurality of cell columns, each of the plurality of cell columns comprising a plurality of solar cells, each of the solar cells having an inner side, an outer side, a top side, and a bottom side, the inner side being vertical, the top side and the bottom side extending perpendicularly from the inner side, and the outer side having an upper section extending perpendicularly from the top side, a lower section extending perpendicularly from the bottom side, and a medial indent section extending between the upper section and the lower section towards the inner side, the inner side defining an upper square portion, a medial thin portion, and a lower square portion of the solar cell, each cell column having a space between the adjacent cell columns to allow light to pass therethrough, a width of each of the upper square portion and the lower square portion of each solar cell substantially conforming to a width of the space between the upper square portions and the lower square portions of the solar cells of adjacent cell columns;
a pair of encapsulant sheets coupled to the plurality of cell columns, the pair of encapsulant sheets being coupled together on either side of the plurality of cell columns to maintain the arrangement of the cell columns, the pair of encapsulant sheets being translucent, the pair of encapsulant sheets being vacuum laminated ethylene vinyl acetate;
the plurality of cell columns comprising a leftmost column, a plurality of central columns, and a rightmost column, the leftmost column having the solar cells coupled with the top side to the bottom side of the adjacent solar cell with the inner side of each cell adjacent a leftmost edge of the pair of encapsulant sheets, the rightmost column having the solar cells coupled with the top side to the bottom side of the adjacent solar cell with the inner side of each cell adjacent a rightmost edge of the pair of encapsulant sheets, each central column having pairs of the solar cells coupled with the inner side to the inner side, the pairs of the solar cells being coupled with the top sides to the bottom sides of the adjacent pairs of the solar cells;
a bottom frame coupled to the pair of encapsulant sheets, the bottom frame being rectangular and having a bottom horizontal portion and a bottom vertical portion, the pair of encapsulant sheets being coupled to the bottom horizontal portion within the bottom vertical portion;
a top frame coupled to the bottom frame, the top frame conforming to the bottom frame and having a top horizontal portion and a top vertical portion, the top vertical portion being coupled to the bottom vertical portion of the bottom frame to seal the pair of encapsulant sheets between the top horizontal portion and the bottom horizontal portion;
a weather protection pane coupled to the pair of encapsulant sheets, the weather protection pane conforming to the pair of encapsulant sheets and being coupled between the pair of encapsulant sheets and the top frame; and
a moisture protection barrier coupled to the pair of encapsulant sheets, the moisture protection barrier conforming to the pair of encapsulant sheets and being coupled between the pair of encapsulant sheets and the bottom frame.

\* \* \* \* \*